(12) United States Patent
Schnetzka et al.

(10) Patent No.: US 7,764,041 B2
(45) Date of Patent: Jul. 27, 2010

(54) SYSTEM AND METHOD TO EXTEND SYNCHRONOUS OPERATION OF AN ACTIVE CONVERTER IN A VARIABLE SPEED DRIVE

(75) Inventors: Harold R. Schnetzka, York, PA (US); Shreesha Adiga Manoor, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 315 days.

(21) Appl. No.: 11/932,280

(22) Filed: Oct. 31, 2007

(65) Prior Publication Data

US 2008/0174258 A1 Jul. 24, 2008

Related U.S. Application Data

(60) Provisional application No. 60/885,932, filed on Jan. 22, 2007.

(51) Int. Cl.
*H02P 27/04* (2006.01)
(52) U.S. Cl. ............ 318/632; 318/803; 388/907.5
(58) Field of Classification Search ............ 318/628, 318/632, 638, 803, 805; 388/907.5, 911
See application file for complete search history.

(56) References Cited

U.S. PATENT DOCUMENTS

| | | | |
|---|---|---|---|
| 3,593,103 | A | 7/1971 | Chandler et al. |
| 4,308,491 | A | 12/1981 | Joyner, Jr. et al. |
| 4,587,474 | A | 5/1986 | Espelage et al. |
| 4,758,771 | A | 7/1988 | Saito et al. |
| 5,081,368 | A | 1/1992 | West |
| 5,123,080 | A | 6/1992 | Gillett et al. |

(Continued)

FOREIGN PATENT DOCUMENTS

EP  0272776 A2  6/1988

(Continued)

OTHER PUBLICATIONS

Annabelle Van Zyl, Rene Spee, Alex Faveluke, and Shibashis Bhowmik; Voltange Sag Ride-Through for Adjustable-Speed Drives With Active Rectifiers; Nov./Dec. 1998; vol. 34, Issue No. 6; IEEE Transactions on Industry Applications.

(Continued)

*Primary Examiner*—Rina I Duda
(74) *Attorney, Agent, or Firm*—McNees Wallace & Nurick, LLC

(57) ABSTRACT

Systems and methods for synchronous operation of variable speed drives having active converters include extending the synchronous operation of an active converter to the AC mains voltage during complete line dropout. A phase angle control circuit includes a squaring amplifier, a first phase-lock loop circuit associated and a second phase-lock loop circuit. The squaring amplifier receives the AC power source and outputs a rectangular output signal to a pair of phase lock loop (PLL) circuits. The first PLL circuit with a first lag-lead filter is configured with a high cutoff frequency to provide the converter stage with a phase angle parameter; and the second phase-lock loop circuit including a second lag-lead filter configured to have a low cutoff frequency to provide the lag-lead filter the capability of storing the phase angle of the mains voltage during mains interruption.

15 Claims, 4 Drawing Sheets

U.S. PATENT DOCUMENTS

| | | | |
|---|---|---|---|
| 5,127,085 A | 6/1992 | Becker et al. | |
| 5,298,848 A | 3/1994 | Ueda et al. | |
| 5,359,298 A * | 10/1994 | Abe | 331/2 |
| 5,410,230 A | 4/1995 | Bessler et al. | |
| 5,592,058 A | 1/1997 | Archer et al. | |
| 5,646,458 A | 7/1997 | Bowyer et al. | |
| 5,747,955 A | 5/1998 | Rotunda et al. | |
| 5,767,609 A * | 6/1998 | Suganuma | 310/316.02 |
| 5,796,234 A | 8/1998 | Vrionis | |
| 5,869,946 A | 2/1999 | Carobolante | |
| 5,936,855 A | 8/1999 | Salmon | |
| 5,969,966 A | 10/1999 | Sawa et al. | |
| 6,005,362 A | 12/1999 | Enjeti et al. | |
| 6,072,302 A | 6/2000 | Underwood et al. | |
| 6,118,676 A | 9/2000 | Divan et al. | |
| 6,160,722 A | 12/2000 | Thommes et al. | |
| 6,239,513 B1 | 5/2001 | Dean et al. | |
| 6,276,148 B1 | 8/2001 | Shaw | |
| 6,313,600 B1 | 11/2001 | Hammond et al. | |
| 6,348,775 B1 | 2/2002 | Edelson et al. | |
| 6,487,096 B1 | 11/2002 | Gilbreth et al. | |
| 6,559,562 B1 | 5/2003 | Rostron | |
| 6,686,718 B2 | 2/2004 | Jadric et al. | |
| 6,768,284 B2 | 7/2004 | Lee et al. | |
| 6,801,019 B2 | 10/2004 | Haydock et al. | |
| 7,081,734 B1 | 7/2006 | Jadric et al. | |
| 2003/0015873 A1 | 1/2003 | Khalizadeh et al. | |
| 2003/0052544 A1 | 3/2003 | Yamamoto et al. | |
| 2005/0057210 A1 | 3/2005 | Ueda et al. | |
| 2005/0068001 A1 | 3/2005 | Skaug et al. | |
| 2005/0237120 A1 * | 10/2005 | Park | 331/16 |
| 2007/0063668 A1 | 3/2007 | Schnetzke et al. | |

FOREIGN PATENT DOCUMENTS

| | | |
|---|---|---|
| EP | 0283954 A2 | 9/1988 |
| EP | 0422221 A1 | 11/1989 |
| EP | 1300937 A2 | 4/2003 |
| EP | 0313366 A2 | 8/2008 |
| JP | 06105563 | 9/1992 |
| JP | 05068376 | 3/1993 |
| JP | 2002176767 | 6/2002 |
| JP | 04026374 | 9/2006 |
| WO | 9314559 A1 | 7/1993 |
| WO | 9732168 A1 | 9/1997 |

OTHER PUBLICATIONS

Annette Von Jouanne, Prasad N. Enjeti, and Basudeb Banerjee; Assessment of Ride-Through Alternatives for Adjustable-Speed Drives; Jul./Aug. 1999; vol. 35, Issue No. 4; IEEE Transactions on Industry Applications.

* cited by examiner

SYSTEM AND METHOD TO EXTEND SYNCHRONOUS OPERATION OF AN ACTIVE CONVERTER IN A VARIABLE SPEED DRIVE

CROSS REFERENCES TO RELATED APPLICATIONS

This patent application claims the benefit of U.S. Provisional Patent Application No. 60/885,932, filed Jan. 22, 2007, for which priority is claimed.

BACKGROUND

The present application relates generally to variable speed drives. The application relates more specifically to systems and methods for synchronous operation of variable speed drives having active converters.

A variable speed drive (VSD) for heating, ventilation, air-conditioning and refrigeration (HVAC&R) applications typically includes a rectifier or converter, a DC link, and an inverter. More recent advances in drive technology have introduced the concept of an active converter. The active converter provides the drive with the capability to provide sinusoidal input current loading to the power mains, alleviating issues with low order harmonic currents creating low order harmonic voltage distortion on the distribution voltage of the mains.

VSDs that incorporate active converter technology to provide power factor correction and reduced input current harmonics also generate a significantly higher level of common mode RMS and peak to peak voltage to the motor stator windings as compared to conventional VSDs. This common mode voltage can be coupled to the rotor of the motor via various stray machine capacitances, causing motor and compressor bearing fluting, and these common mode voltages which result in currents flowing through the machine bearings may cause premature bearing failures in the motor and/or compressor.

Proper operation of the active converter control methodology, using the synchronous d-q reference frame requires knowledge of the instantaneous phase angle of the input line-to-line voltage. If the reference frame angle is incorrect or unknown, then the input power factor and the harmonic distortion of the input current to the Variable Speed Drive (VSD) with Active Converter cannot be controlled properly. If the VSD is required to ride-through an extended loss of the input line-to-line voltage and re-synchronize to the input mains when the power is restored, a means to retain the expected d-q reference frame angle during the loss of mains is needed. In addition, a means to quickly lock back onto the input mains line-to-line voltage and generate the actual phase angle of the line-to-line voltage is required.

What are needed are a system and/or method that satisfy one or more of these needs or provides other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment relates to a variable speed drive system configured to receive an input AC voltage at a fixed AC input voltage and provide an output AC power at a variable voltage and variable frequency. The variable speed drive includes a converter stage connected to an AC power source providing the input AC voltage, the converter stage being configured to convert the input AC voltage to a boosted DC voltage; a DC link connected to the converter stage, the DC link being configured to filter and store the boosted DC voltage from the converter stage; and an inverter stage connected to the DC link, the inverter stage being configured to convert the boosted DC voltage from the DC link into the output AC power having the variable voltage and the variable frequency. The variable speed drive also includes at least one of: a filter for preventing bearing erosion due to common mode and differential mode filtering; a phase angle tracking system for retaining knowledge of the input AC mains line-to-line voltage phase angle under all conditions including two Phase-Locked-Loops (PPL) within the Active Converter controls methodology, the two PLLs including a lead-lag filter with a relatively high filter cutoff frequency and small value integrating capacitor; an integral bypass Active Converter configuration for VSD controlled systems that operate at a maximum frequency & voltage equal to the power line mains frequency supplied to the VSD, having a contactor bypass to eliminate the losses associated with the VSD when the system is required to operate at maximum frequency; a liquid- or refrigerant-cooled inductor, wherein the liquid- or refrigerant-cooled inductor; a power assembly, comprising: (1) a film-based DC link capacitor (2) a plurality of plastic coolers mounted on at least one power electronic module (3) a plurality of active converter IGBT modules (3) at least one laminated copper busbar (4) at least one gate Driver control board (5) at least one inverter gate resistor control board and (6) at least one a converter gate resistor control board; and a cooler module composed of a plastic material that can operate at a continuous use temperature of approximately 100 degrees centigrade.

Another embodiment relates to a method to extend the synchronous operation of an Active Converter to the AC mains voltage during complete line dropout.

Another embodiment relates to an Active Converter-based Variable Speed Drive system with Improved Full Speed Efficiency.

Another embodiment relates to a liquid- or refrigerant-cooled inductor. The liquid- or refrigerant-cooled inductor may be used in any application where liquid or refrigerant cooling is available and a reduction in size and weight of a magnetic component is desired.

Certain advantages of the embodiments described herein are the integral bypass Active Converter configuration may be utilized for VSD controlled systems that operate at a maximum frequency & voltage equal to the power line mains frequency supplied to the VSD. Contactor bypass eliminates the losses associated with the VSD when the system is required to operate at maximum frequency.

One advantage is to reduce the common mode voltage stress presented to the motor stator in both RMS and peak terms, thereby alleviating issues associated with premature machine bearing failure and premature insulation to earth ground failure. Another advantage is to reduce the differential mode voltage stress presented to the motor stator in both RMS and peak terms, thereby alleviating issues associated with premature machine turn-to-turn stator winding failure. Finally, the application addresses the issue of conducted EMI/RFI emissions associated with Active Converter operation.

The present invention incorporates the following components into a compact, lightweight, easily serviceable and low cost power assembly: (1) Film based DC link capacitor (2) Plastic coolers for power electronic modules (3) Active Converter IGBT modules (3) Laminated copper busbar (4) Gate Driver control board (5) Inverter gate resistor control board (6) Converter gate resistor control board.

Further, Variable Speed Drives incorporating Active Converter technology require the use of three phase inductors that are physically large, lossy and expensive as compared to a conventional passive converter based VSD design. Another advantage of the invention disclosed is the reduced size, weight and cost of the inductor required by the Active Converter-based VSD through the use of liquid or refrigerant cooling of the inductor core. The coils of the inductor are also cooled through by the core cooling means by conduction of the heat to the core.

Alternative exemplary embodiments relate to other features and combinations of features as may be generally recited in the claims.

BRIEF DESCRIPTION OF THE FIGURES

The application will become more fully understood from the following detailed description, taken in conjunction with the accompanying figures, wherein like reference numerals refer to like elements, in which.

DETAILED DESCRIPTION OF THE EXEMPLARY EMBODIMENTS

Before turning to the figures which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Figure 1A:
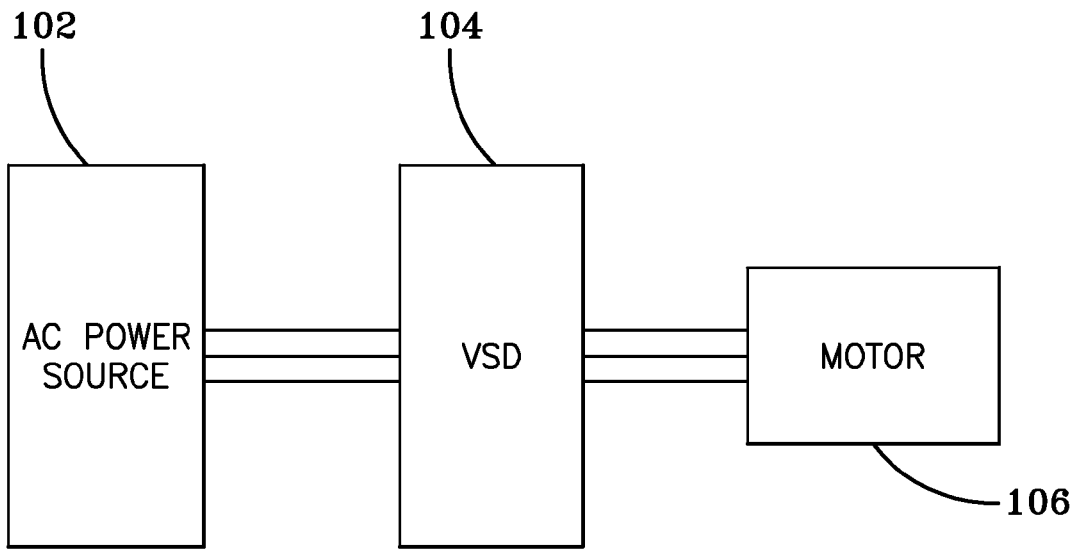
FIGS. 1A and 1B illustrate schematically a general system configuration.
Figure 1B:
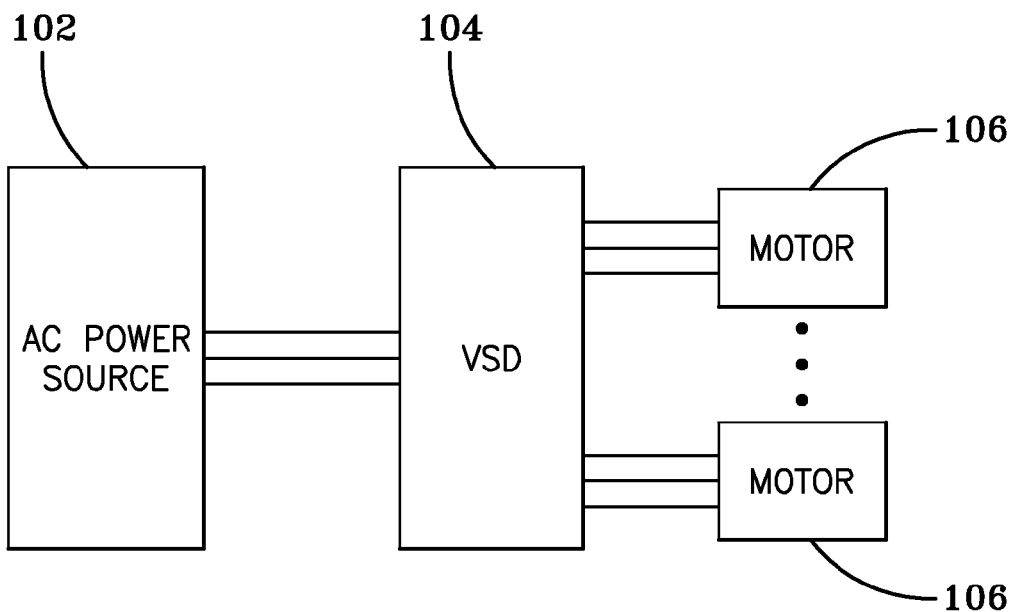

FIGS. 1A and 1B illustrate generally system configurations. An AC power source 102 supplies a variable speed drive (VSD) 104, which powers a motor 106 (see FIG. 1A) or motors 106 (see FIG. 1B). The motor(s) 106 is preferably used to drive a corresponding compressor of a refrigeration or chiller system (see generally, FIG. 3). The AC power source 102 provides single phase or multi-phase (e.g., three phase), fixed voltage, and fixed frequency AC power to the VSD 104 from an AC power grid or distribution system that is present at a site. The AC power source 102 preferably can supply an AC voltage or line voltage of 200 V, 230 V, 380 V, 460 V, or 600 V, at a line frequency of 50 Hz or 60 Hz, to the VSD 104 depending on the corresponding AC power grid.

The VSD 104 receives AC power having a particular fixed line voltage and fixed line frequency from the AC power source 102 and provides AC power to the motor(s) 106 at a desired voltage and desired frequency, both of which can be varied to satisfy particular requirements. Preferably, the VSD 104 can provide AC power to the motor(s) 106 having higher voltages and frequencies and lower voltages and frequencies than the rated voltage and frequency of the motor(s) 106. In another embodiment, the VSD 104 may again provide higher and lower frequencies but only the same or lower voltages than the rated voltage and frequency of the motor(s) 106. The motor(s) 106 is preferably an induction motor, but can include any type of motor that is capable of being operated at variable speeds. The induction motor can have any suitable pole arrangement including two poles, four poles or six poles.

Figure 2A:
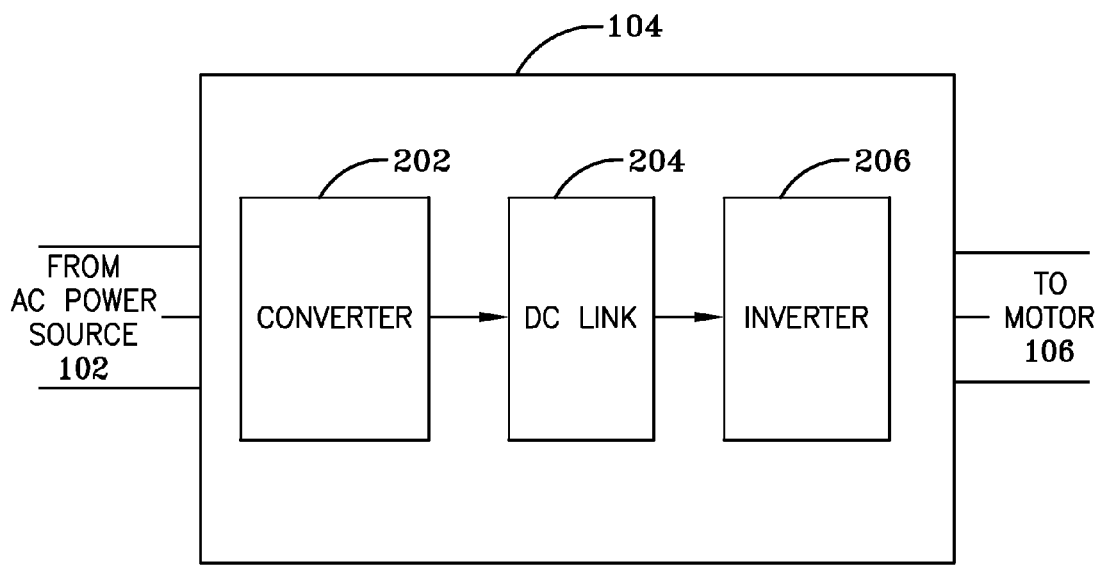
FIGS. 2A and 2B illustrate schematically embodiments of variable speed drives.
Figure 2B:
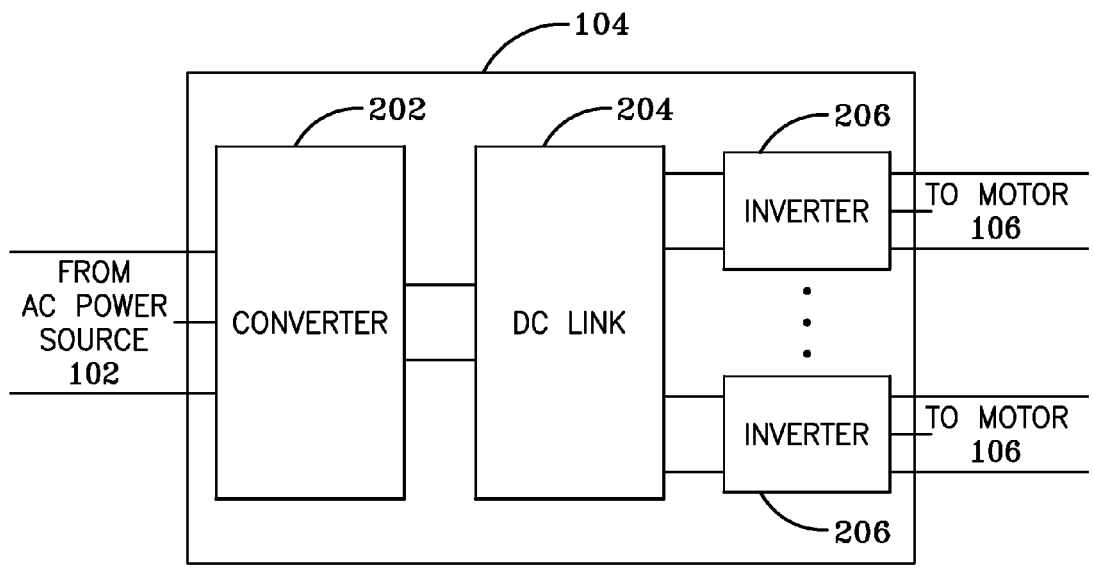

FIGS. 2A and 2B illustrate different embodiments of the VSD 104. The VSD 104 can have three stages: a converter stage 202, a DC link stage 204 and an output stage having one inverter 206 (see FIG. 2A) or a plurality of inverters 206 (see FIG. 2B). The converter 202 converts the fixed line frequency, fixed line voltage AC power from the AC power source 102 into DC power. The DC link 204 filters the DC power from the converter 202 and provides energy storage components. The DC link 204 can be composed of capacitors and inductors, which are passive devices that exhibit high reliability rates and very low failure rates. Finally, in the embodiment of FIG. 2A, the inverter 206 converts the DC power from the DC link 204 into variable frequency, variable voltage AC power for the motor 106 and, in the embodiment of FIG. 2B, the inverters 206 are connected in parallel on the DC link 204 and each inverter 206 converts the DC power from the DC link 204 into a variable frequency, variable voltage AC power for a corresponding motor 106. The inverter(s) 206 can be a power module that can include power transistors, insulated gate bipolar transistor (IGBT) power switches and inverse diodes interconnected with wire bond technology. Furthermore, it is to be understood that the DC link 204 and the inverter(s) 206 of the VSD 104 can incorporate different components from those discussed above so long as the DC link 204 and inverter(s) 206 of the VSD 104 can provide the motors 106 with appropriate output voltages and frequencies.

With regard to FIGS. 1B and 2B, the inverters 206 are jointly controlled by a control system such that each inverter 206 provides AC power at the same desired voltage and frequency to corresponding motors based on a common control signal or control instruction provided to each of the inverters 206. In another embodiment, the inverters 206 are individually controlled by a control system to permit each inverter 206 to provide AC power at different desired voltages and frequencies to corresponding motors 106 based on separate control signals or control instructions provided to each inverter 206. This capability permits the inverters 206 of the VSD 104 to more effectively satisfy motor 106 and system demands and loads independent of the requirements of other motors 106 and systems connected to other inverters 206. For example, one inverter 206 can be providing full power to a motor 106, while another inverter 206 is providing half power to another motor 106. The control of the inverters 206 in either embodiment can be by a control panel or other suitable control device.

For each motor 106 to be powered by the VSD 104, there is a corresponding inverter 206 in the output stage of the VSD 104. The number of motors 106 that can be powered by the VSD 104 is dependent upon the number of inverters 206 that are incorporated into the VSD 104. In one embodiment, there can be either 2 or 3 inverters 206 incorporated in the VSD 104 that are connected in parallel to the DC link 204 and used for powering a corresponding motor 106. While the VSD 104 can have between 2 and 3 inverters 206, it is to be understood that more than 3 inverters 206 can be used so long as the DC link 204 can provide and maintain the appropriate DC voltage to each of the inverters 206.

Figure 3:
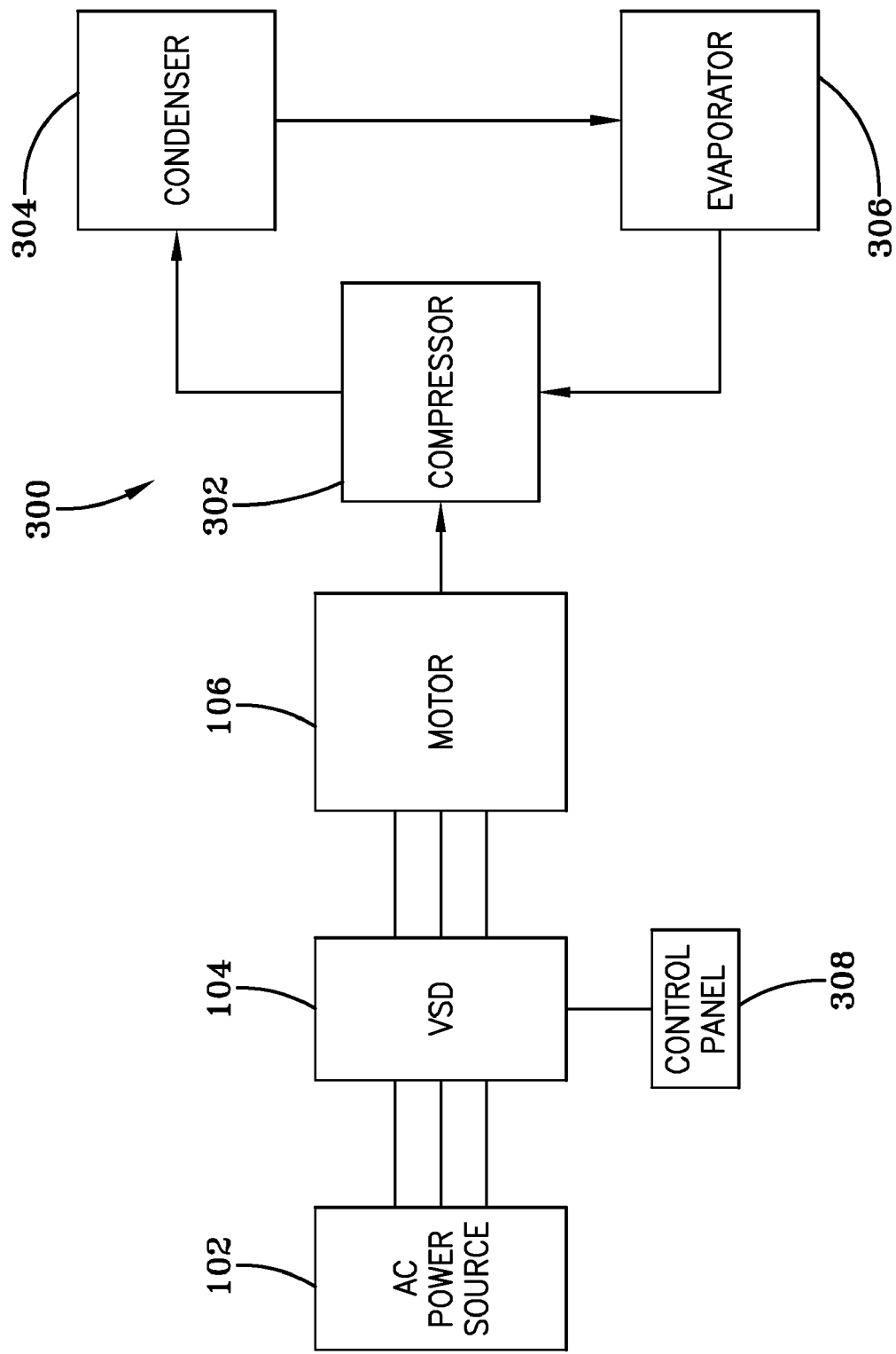
FIG. 3 illustrates schematically a refrigeration system.

FIG. 3 illustrates generally one embodiment of a refrigeration or chiller system using the system configuration and VSD 104 of FIGS. 1A and 2A. As shown in FIG. 3, the HVAC, refrigeration or liquid chiller system 300 includes a compressor 302, a condenser arrangement 304, a liquid chiller or evaporator arrangement 306 and the control panel 308. The compressor 302 is driven by motor 106 that is powered by VSD 104. The VSD 104 receives AC power having a particular fixed line voltage and fixed line frequency from AC power source 102 and provides AC power to the motor 106 at desired voltages and desired frequencies, both of which can be varied to satisfy particular requirements. The control panel 308 can include a variety of different components such as an analog to digital (A/D) converter, a microprocessor, a non-volatile memory, and an interface board, to control operation of the refrigeration system 300. The control panel 308 can also be used to control the operation of the VSD 104, and the motor 106.

Compressor 302 compresses a refrigerant vapor and delivers the vapor to the condenser 304 through a discharge line. The compressor 302 can be any suitable type of compressor, e.g., screw compressor, centrifugal compressor, reciprocating compressor, scroll compressor, etc. The refrigerant vapor delivered by the compressor 302 to the condenser 304 enters into a heat exchange relationship with a fluid, e.g., air or water, and undergoes a phase change to a refrigerant liquid as a result of the heat exchange relationship with the fluid. The condensed liquid refrigerant from condenser 304 flows through an expansion device (not shown) to the evaporator 306.

The evaporator 306 can include connections for a supply line and a return line of a cooling load. A secondary liquid, e.g., water, ethylene, calcium chloride brine or sodium chloride brine, travels into the evaporator 306 via return line and exits the evaporator 306 via supply line. The liquid refrigerant in the evaporator 306 enters into a heat exchange relationship with the secondary liquid to lower the temperature of the secondary liquid. The refrigerant liquid in the evaporator 306 undergoes a phase change to a refrigerant vapor as a result of the heat exchange relationship with the secondary liquid. The vapor refrigerant in the evaporator 306 exits the evaporator 306 and returns to the compressor 302 by a suction line to complete the cycle. It is to be understood that any suitable configuration of condenser 304 and evaporator 306 can be used in the system 300, provided that the appropriate phase change of the refrigerant in the condenser 304 and evaporator 306 is obtained.

The HVAC, refrigeration or liquid chiller system 300 can include many other features that are not shown in FIG. 3. These features have been purposely omitted to simplify the drawing for ease of illustration. Furthermore, while FIG. 3 illustrates the HVAC, refrigeration or liquid chiller system 300 as having one compressor connected in a single refrigerant circuit, it is to be understood that the system 300 can have multiple compressors, powered by a single VSD as shown in FIGS. 1B and 2B or multiple VSDs, see generally, the embodiment shown in FIGS. 1A and 2A, connected into each of one or more refrigerant circuits.

Figure 4:
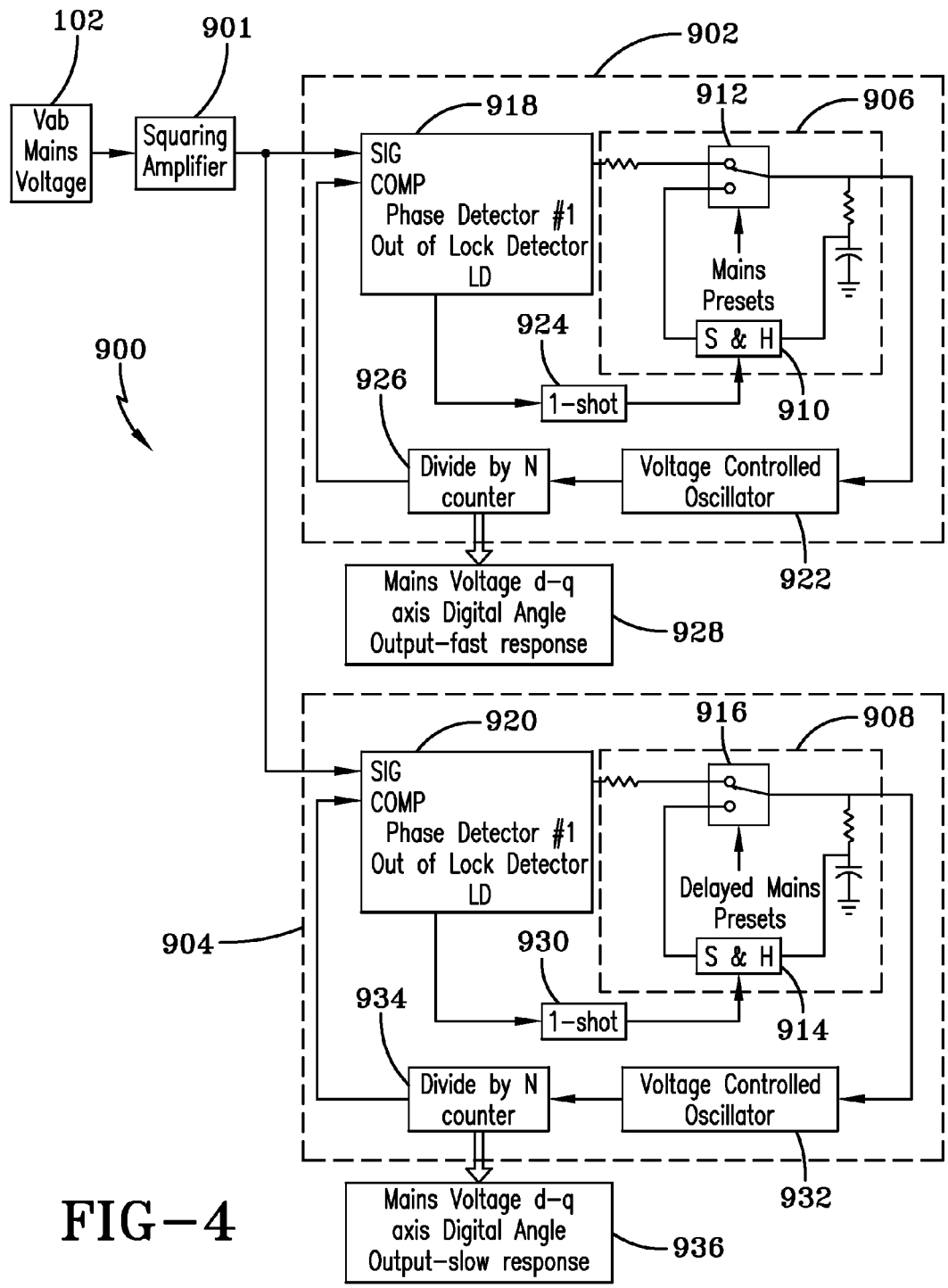
FIG. 4 is a block diagram of active converter mains angle retention control means.

Referring next to FIG. 4, a mains phase angle (MPA) control system, generally designated as 900 is illustrated. The control system 900 provides retention of the phase angle information for the AC input source or mains voltage 102 during input voltage dropout. The mains voltage 102 is applied to a squaring amplifier 901 to generate a substantially rectangular output signal from the ac input signal. The output of the squaring amplifier is simultaneously input to a pair of phase-locked-loops (PPLs) 902, 904. The first PLL 902 has a phase detector 918 for comparing the reference signal SIG with a comparison signal COMP for detecting when the phase of the input signal is out of lock with a voltage controlled oscillator (VCO) 922. If the phase detector 918 detects that the two inputs SIG and COMP are out of phase lock, a reset signal is output from terminal LD of the phase detector 918 to a 1-shot circuit 924. The 1-shot circuit 924 generates a narrow pulse input to a sample and hold (S&H) circuit 910. The output error signal of phase detector 918 is passed through a lag-lead filter circuit 906 to VCO 922. The output signal from the VCO 922 is then input to a divide-by-N circuit 926. The divide-by-N circuit 926 provides the comparison signal which is applied to the COMP terminal of the phase detector 918, and also outputs a second signal indicating the mains voltage d-q axis digital angle output fast response 928.

The second PLL 904 circuit is similarly configured as PLL 902, described above, with phase detector 920 comparing the input reference signal SIG with a comparison signal COMP, and outputting an error signal to lag-lead filter 908. The lag-lead filter 908 has S&H circuit 914 controlled by 1-shot circuit 930 and analog switch 916. The lag-lead filter 908 has a low cutoff frequency, as more fully described below. The VCO 932 is input to a divide-by-N circuit 934, which generates the COMP signal input to the phase detector 920, and outputs a second signal indicating the mains voltage d-q axis digital angle output slow response 936.

The control system 900 may be used to retain synchronous operation of a VSD 104 with an active converter 202 to reduce current distortion and eliminate regeneration of energy upon reapplication of the AC input mains voltage 102—for providing extended ride-through capability in the VSD 104. Use of the two PLLs 902, 904 enables the control system 900 to maximize the ability of the active converter 202 to retain the best available knowledge of the line-to-line voltage phase angle at the AC input source 102 under all conditions. The first PLL 902 lag-lead filter 906 has a relatively high filter cutoff frequency and small value integrating capacitor C1. This filter 906 provides the active converter 202 the capability for fast and accurate phase angle tracking under normal converter operating conditions. The filter 906 components include resistor R1, resistor R2 and capacitor C1. In one embodiment the component value for resistor R1 may be 43K ohms, for resistor R2, 120K ohms, and for capacitor C1, 0.47 uF, although the lag-lead filter 906 components R1, R2 and C1 may be varied to adjust the desired cutoff frequency of the filter 906. The second PLL 904 lag-lead filter 908 has a low cutoff frequency, a large value integrating capacitor C2, and resistors R3 and R4. The low cutoff frequency provides the lag-lead filter 908 with the capability for storing the angle of the mains voltage in the feedback loop of the PLL during mains interruption. In one embodiment the typical component values for R3, R4 and C2 may be 510K ohms, 68K ohms and 2.2 uF, respectively. To increase the capability to retain mains phase angle information during a power interruption, each PLL feedback loop 906, 908 includes a sample and hold circuit (S&H) 910, 914 respectively, and analog switch integrated circuits 912, 916 respectively. The S&H circuits 910, 914 with analog switches 912, 916 hold the stored charge on the integrating capacitors C1, C2 within each lag-lead filter 906, 908, and prevent the discharge of the capacitors C1, C2 through leakage to the output of the phase detectors. The component sizing of the ratio R3/R4 is also selected to minimize step change in the voltage fed to the Voltage Controlled Oscillator 932 when the analog switch 916 is transitioned.

The position of each analog switch 912, 916 is controlled by the sensing of the total loss of the mains voltage 102 via the mains voltage detector (or mains present) circuitry. The sample and hold circuits 910, 914 are controlled by the out of lock detectors incorporated into each phase detector. The VCO outputs are fed to divide by n bit counters 926, 934, where n is chosen as a function of the resolution of the phase angle required in the specific application. The counter outputs are then fed back into the second input (denoted COMP) of each phase detector 918, 920 to form a closed loop. The counter outputs are also used to provide a digital word 928,

936 representative of the mains phase angle. The digital words 928, 936 then govern the d-q angle output during mains interruption. Selection of timing to transition the phase angle information is a function of the specific application but ordinarily one would use the mains voltage detector (mains present) circuitry. In one embodiment the PLLs 902, 904 may be implemented using a 74HC7046 integrated circuit manufactured by Phillips Semiconductor Corp. The 74HC7046 integrated circuit includes a state machine type phase detector with out of lock detector and a Voltage Controlled Oscillator. The circuit design allows a power interruption of up to one second in duration without incurring phase error beyond a specified angle under worst-case conditions.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

The present application contemplates methods, systems and program products on any machine-readable media for accomplishing its operations. The embodiments of the present application may be implemented using an existing computer processors, or by a special purpose computer processor for an appropriate system, incorporated for this or another purpose or by a hardwired system.

It is important to note that the construction and arrangement of the mains phase angle control system, as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

As noted above, embodiments within the scope of the present application include program products comprising machine-readable media for carrying or having machine-executable instructions or data structures stored thereon. Such machine-readable media can be any available media which can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions comprise, for example, instructions and data which cause a general purpose computer, special purpose computer, or special purpose processing machines to perform a certain function or group of functions.

It should be noted that although the figures herein may show a specific order of method steps, it is understood that the order of these steps may differ from what is depicted. Also two or more steps may be performed concurrently or with partial concurrence. Such variation will depend on the software and hardware systems chosen and on designer choice. It is understood that all such variations are within the scope of the application. Likewise, software implementations could be accomplished with standard programming techniques with rule based logic and other logic to accomplish the various connection steps, processing steps, comparison steps and decision steps.

What is claimed is:

1. A variable speed drive system configured to receive an input AC voltage at a fixed AC input voltage and provide an output AC power at a variable voltage and variable frequency, the variable speed drive comprising:
   a converter stage connected to an AC power source providing the input AC voltage, the converter stage being configured to convert the input AC voltage to a boosted DC voltage;
   a DC link connected to the converter stage, the DC link being configured to filter and store the boosted DC voltage from the converter stage; and
   an inverter stage connected to the DC link, the inverter stage being configured to convert the boosted DC voltage from the DC link into the output AC power having the variable voltage and the variable frequency; and
   a phase angle control circuit comprising:
      a squaring amplifier, a first phase-lock loop circuit and a second phase-lock loop circuit;
      the squaring amplifier configured to receive the AC power source and output a substantially rectangular output signal based on the AC power source;
      the first phase-lock loop circuit including a first lag-lead filter configure to have a high filter cutoff frequency and a first capacitor to provides the converter stage with a phase angle parameter; and
      the second phase-lock loop circuit including a second lag-lead filter configured to have a low cutoff frequency and a second capacitor to provide the second lag-lead filter the capability of storing an angle of the input AC voltage in a feedback loop of the second phase-lock loop during an AC power source interruption.

2. The variable speed drive of claim 1, wherein the first lag-lead filter includes a first resistor, a second resistor, wherein the first resistor has a resistance less than the second resistor, and the first capacitor is a small value integrating capacitor.

3. The variable speed drive of claim 2, wherein the resistance value for first resistor is about 43K ohms, and the resistance value for second resistor is about 120K ohms, and the capacitance of the first capacitor is about 0.47 uF.

4. The variable speed drive of claim 3, wherein the second lag-lead filter includes a third resistor and a fourth resistor, wherein the third resistor has a resistance greater than the fourth resistor, and the second capacitor is a large value integrating capacitor.

5. The variable speed drive of claim 4, wherein the resistance value the third resistor is about 510K ohms, the resistance value the fourth resistor is about 68K ohms and the capacitance value of the second capacitor is 2.2 uF.

6. The variable speed drive of claim 1, wherein each of the first phase-lock loop circuit and the second phase lock loop circuit includes a first sample and hold circuit and a first analog switch in communication with the first sample and hold circuit, the analog switch configured to hold a stored charge on the associated first or second capacitors within the first or second lag-lead filter and to prevent the discharge of the associated first or second capacitors.

7. The variable speed drive of claim 2, wherein the first resistor, the second resistor and the first capacitor are selected for fast locking operation of the first phase-lock loop.

8. The variable speed drive of claim 4, wherein the third resistor and the fourth resistor are selected based on their resistance values to provide a resistance ratio between the third resistor and the fourth resistor that minimizes step changes in a voltage fed to the Voltage Controlled Oscillator when the second analog switch changes state.

9. The variable speed drive of claim 6, wherein each analog switch of the first and second phase lock loop further including a mains voltage detector circuit controlled by sensing a loss of the AC power source input AC voltage.

10. The variable speed drive of claim 6, wherein each of the first and second phase lock loop having a phase detector circuit, a Voltage Controlled Oscillator and a divide by N circuit, the phase detector circuit having an out-of-lock detector responsive to a phase difference between the squaring amplifier square wave output and a comparison feedback signal generated by the divide by N counter in response to the voltage control oscillator.

11. The variable speed drive of-claim 10 wherein a divisor n of the divide-by-n counter is selected based on a desired resolution of the phase angle for a predetermined application.

12. The variable speed drive of claim 11 wherein the divide by n counter processes an output of the voltage controlled oscillator to generate a feedback signal, and the feedback signal is applied to a second input terminal of each phase detector to form a closed loop.

13. The variable speed drive of claim 12, wherein the divide by n counter generates a digital word representative of the mains phase angle, the digital word used to control a d-q angle of the output of the variable speed drive during an AC power source mains interruption.

14. The variable speed drive of claim 13, wherein the first phase-lock loop circuit and the second phase lock loop circuit are configured to maintain synchronous operation during a loss of the AC power source.

15. The variable speed drive of claim 14, wherein the duration of loss of the AC power source may be up to one second in duration while the drive maintains a phase error within a predetermined angle limit.

* * * * *

UNITED STATES PATENT AND TRADEMARK OFFICE
CERTIFICATE OF CORRECTION

| | | |
|---|---|---|
| PATENT NO. | : 7,764,041 B2 | Page 1 of 1 |
| APPLICATION NO. | : 11/932280 | |
| DATED | : July 27, 2010 | |
| INVENTOR(S) | : Schnetzka et al. | |

It is certified that error appears in the above-identified patent and that said Letters Patent is hereby corrected as shown below:

Column 2, line 13-14: "Phase-Locked-Loops (PPL)" should read --Phase-Locked Loops (PLL)--
Column 5, line 59: "phase-locked-loops (PPLs)..." should read --phase-locked-loops (PLLs)...--

Signed and Sealed this
Twenty-eighth Day of December, 2010

David J. Kappos
*Director of the United States Patent and Trademark Office*